United States Patent [19]

Satou et al.

[11] Patent Number: 5,294,321
[45] Date of Patent: Mar. 15, 1994

[54] SPUTTERING TARGET

[75] Inventors: Michio Satou; Takashi Yamanobe; Mitsuo Kawai; Tatsuzo Kawaguchi, all of Yokohama; Kazuhiko Mitsuhashi, Chigasaki; Toshiaki Mizutani, Yokohama, all of Japan

[73] Assignee: Kabushiki Kaisha Toshiba, Kawasaki, Japan

[21] Appl. No.: 974,317

[22] Filed: Nov. 10, 1993

Related U.S. Application Data

[63] Continuation of Ser. No. 769,168, Sep. 30, 1991, abandoned, which is a continuation of Ser. No. 454,393, Dec. 21, 1989, abandoned.

[30] Foreign Application Priority Data

| Dec. 21, 1988 | [JP] | Japan | 63-322423 |
| Dec. 23, 1988 | [JP] | Japan | 63-325310 |
| Dec. 26, 1988 | [JP] | Japan | 63-328441 |
| Jul. 28, 1989 | [JP] | Japan | 1-194344 |
| Jul. 28, 1989 | [JP] | Japan | 1-194346 |

[51] Int. Cl.$^5$ .................................................. C23C 14/34
[52] U.S. Cl. ............................... 204/298.13; 204/192.23
[58] Field of Search ............... 204/192.15, 192.23, 204/298.12, 298.13; 501/96

[56] References Cited

U.S. PATENT DOCUMENTS

| 4,424,101 | 1/1984 | Nowicki | 204/192.23 |
| 4,619,697 | 10/1986 | Hijikata et al. | 75/230 |
| 4,663,120 | 5/1987 | Parent et al. | 419/10 |

FOREIGN PATENT DOCUMENTS 61-179534  1/1985  Japan.
63-219580  3/1987  Japan.

OTHER PUBLICATIONS

"Self-burning sintering method" Y. Miyamoto, Functional Material 8 (1) Jan., 1989.

Primary Examiner—Nam Nguyen
Attorney, Agent, or Firm—Oblon, Spivak, McClelland, Maier & Neustadt

[57] ABSTRACT

A sputtering target formed of a refractory metallic silicide having a composition $MSi_x$ including a mixture composition of an $MSi_2$ phase in the form of particles (M: at least one refractory metal selected from a group consisting of W, Mo, Ti, Zr, Hf, Ni and Ta), and an Si phase provided as a matrix phase. Interface layers having a predetermined thickness are formed at the interfaces between the $MSi_2$ phase and the Si phase. The value X in the composition formula $MSi_x$ is set to a range of 2.0 to 4.0, and the thickness of the interface layers formed between the $MSi_2$ phase and the Si phase, the dispersion of the composition, the density ratio of the target, the electrical resistivity of the Si phase and the surface roughness are set to predetermined values. An uniform high-quality thin film in which a composition distribution is uniform can be manufactured stably by using this target.

10 Claims, 2 Drawing Sheets

SPUTTERING TARGET

This application is a continuation of application Ser. No. 07/769,168, filed on Sep. 30, 1991, now abandoned, which was a continuation of Ser. No. 07/454,393, filed on Dec. 21, 1989, now abandoned.

BACKGROUND OF THE INVENTION

This invention relates to a sputtering target formed of refractory metallic silicide and a method of refractory metallic silicide and a method of manufacturing the same and, more particularly, to a sputtering target formed of refractory metallic silicide, having a high density and improved qualities and used for forming thin films as electrodes and wiring members of semiconductor devices, and a method of manufacturing this type of sputtering target.

Conventionally, polysilicon is used for forming electrodes or wiring of semiconductor devices or, more specifically, for forming gate electrodes of metal-oxide-semiconductor (MOS) type large scale integrated circuits (LSI). However, with increase in the degree of integration of LSIs, polysilicon becomes unsatisfactory because of delay of signal propagation due to its resistance which is still disadvantageously large.

On the other hand, for facilitating the formation of devices based on self-alignment, refractory materials to be used as materials for gate, source and drain electrodes are recently in demand, and refractory metallic silicides which are compatible with silicon gate process are regarded as desirable.

Sputtering is known as one of the methods suitable for forming refractory metallic silicide thin films for electrodes or wiring of semiconductor devices. In sputtering methods, argon ions are made to collide against refractory metallic silicide type target so as to release the metal and deposit the same as a thin film on a substrate opposed to the target plate.

The properties of the silicide film formed by sputtering therefore greatly depend upon the characteristics of the target.

Conventionally, such refractory metallic silicide target is obtained by a method (such as the ones disclosed in Japanese Patent Laid-Open Nos. 61-141673 and 61-141674) in which $MiSi_2$ obtained by reaction between a refractory metal powder (such as a powder of W and Mo) and a silicon (Si) powder is hot-pressed together with Si, or a method (such as the ones disposed in Japanese Patent Laid-Open Nos. 61-58866 and 61-179534) in which a semi-sintered silicide body is impregnated with Si.

These conventional methods, however, entail drawbacks described below. In the case of the former, the proportion of the Si phase ranges from 8 ($MSi_{2.2}$) to 25% ($MSi_{2.9}$) by volume and is smaller than that of the $MSi_2$ phase. For this reason, it is not always possible to uniformly spread the Si over the peripheries of angular $MSi_2$ particles obtained by pulverization even if the process is based on hot-press sintering. The resulting target may therefore have a non-uniform and defective structure which has aggregations of angular $MSi_2$ particles having different sizes, localized Si phase portions and pores and which therefore has a large spatial dispersion of its composition such that the composition varies between central and peripheral portions of the plate-like shape of the target.

The melting point of the $MSi_2$ phase greatly varies depending upon the kind of refractory metal M. For example, the melting points of $WSi_2$, $MoSi_2$, $TiSi_2$ and $TaSi_2$ are 2165°, 2030°, 1540° and 2200° C., respectively. Hot press sintering is effected by using the $MSi_2$ phase having such different melting points and the Si phase having a melting point of 1414° C. maintained at a temperature not higher than the eutectic temperature. For this reason, sintering cannot be promoted between thermally stable $MSi_2$ particles, the strength of bonding between the particles is so small that the resulting sintered body is breakable, and pores remain in the resulting structure which reduce the degree of compactness.

In a case where a silicide film is formed by sputtering using a target having such properties, the composition of the silicide film is variable and unstable and it is difficult to obtain the desired film composition, since the distribution of the composition of the target is non-uniform. Also, if sputtering is effected by using a target in which the strength of bonding between particles is small and which has pores, the target may break at its sputtering surface from the positions of defective portions such as those mentioned above so that fine particles come off from the target surface. There is a problem of these particles being mixed in the deposited silicide film.

In a case where work-defect layers having very small cracks or chipped portions formed during mechanical working of the target are not completely removed because target surface finishing is inadequate, or in a case where the load applied through a grinding wheel to the surface to be ground is excessive at the time of grinding of the target so that a residual stress is caused in the target surface portion, the amount of particles coming off from the work-defect layers or residual-stress portions is increased, and the problem of the particles being mixed in the film is also encountered. Other serious problems are thereby experienced, that is, the resistance of the electrode wiring of the resulting semiconductor device is increased or a short-circuit accident takes place, resulting in a considerable reduction in the product yield. Specifically, in the case of high density integrated circuits, the width of the electrode wiring is reduced as the degree of integration is increased as from the 4 megabit scale to the 16 megabit scale, and the short-circuit fraction defective caused by particles mixed in the deposit film is thereby increased abruptly.

In the latter of the above-mentioned conventional methods, the composition of the target is controlled by the density of the semi-sintered silicide body. However, in a case where a semi-sintered body having a predetermined density is made by synthesis of $MSi_2$ based on silicide reaction between a metal powder and a silicon powder, or in a case where a semi-sintered body having a predetermined density is made by sintering a pressed compact formed from an $MSi_2$ powder, the density varies depending upon the processing temperature, the processing time and the pressing pressure, and it is therefore very difficult to obtain a target having the desired composition.

Further, according to the inventors' knowledge, there is no possibility of impurities being collected by diffusion at the interfaces between the $MSi_2$ phase and the Si phase of the target because high-purity $MSi_2$ and Si products are ordinarily used as raw-material powders, and the strengths of interface bonding between the $MSi_2$ phase and the Si phase and interface bonding between $MSi_2$ phase portions are therefore small.

There is also a problem of the sputtering operation being unstable because the difference of the electrical resistances between the MSi$_2$ phase and the Si phase is extremely large. That is, the electrical resistances of WSi$_2$, MoSi$_2$, TiSi$_2$ and TaSi$_2$ capable of constituting the MSi$_2$ phase are 70, 100, 16, and 45 $\mu\Omega$·cm, respectively, and are thus small, while that of the Si phase is $2.3 \times 10^{10}$ $\mu\Omega$·cm and is thus extremely large. The electrical resistance therefore abruptly changes at the interface between the MSi$_2$ phase and the Si phase, also because no impurity diffusion layers exist at the interfaces. Specifically, in the structure of the target made by the latter method, the Si phase constituting the matrix phase is in a continuous form, and small-resistance MSi$_2$ phase portions are surrounded by the large-resistance Si phase portion.

If sputtering is effected by using a target having such a structure, insulation breakdown of the MSi$_2$ phase and the Si phase necessarily takes place at a voltage higher than a certain level, and a discharge starts flowing. That is, if the applied voltage is higher than a certain level, discharge takes place, and parts of MSi$_2$ particles or the Si phase of a small interface strength thereby come off and disperse as fine particles.

Serious problems are thereby encountered; the resistance of the electrode wiring of the resulting semiconductor device is increased or a short-circuit accident takes place, resulting in a considerable reduction in the product yield.

If sputtering is effected under optimum deposition conditions by using a conventional target formed of an alloy of a refractory metal and silicon to form a refractory metallic silicide film on a substrate, the distribution of the film thickness can be made uniform but the proportion of the refractory metal in the film composition is larger at a central portion of the substrate than at a peripheral portion, and a trough-curve distribution of the MSi$_x$ composition is exhibited.

Accordingly, the distribution of the sheet resistance of the thin film is as represented by a trough curve, and the dispersion of the electrical characteristics in the film on the substrate surface is large.

It is considered that this non-uniformity of the distribution of the composition of the thin film formed on the substrate surface is mainly due to a large difference between the sputter release angle distributions of the refractory metal (M) and the silicon (Si) and due to the variation of the amount of Si atoms dispersed by argon (Ar) atoms which variation depends upon the relative positions of the target and the substrate.

In addition, since the film composition at the substrate center is rich in the refractory metal, the film stress thereat is high and the thin film may be easily peeled off during heating oxidation in a later processing step.

It is difficult to prevent occurrence of such non-uniformity of the film composition even by variously changing the deposition conditions relating to the position of the magnetic field generator and the processing voltage.

The inventors had an idea of forming a target having a composition distribution reverse to the film composition distribution such that the distribution of the composition of a thin film formed by sputtering using this target can be made uniform.

In the conventional manufacturing methods, however, it is extremely difficult to obtain a target having a composition distribution in which the proportion of a component is continuously changed and, hence, to make the composition distribution in the formed thin film uniform.

SUMMARY OF THE INVENTION

An object of the present invention is to substantially eliminate defects and drawbacks encountered to the prior art described above and to provide a sputtering target which is formed of a refractory metallic silicide having improved qualities, which has a composition for enabling the formation of a silicide film stable and having a uniform composition, and which is substantially free from generation of particles, and to provide a method of manufacturing this target.

This and other objects can be achieved according to this invention in one aspect by providing a sputtering target formed of a refractory metallic silicide in accordance with the present invention comprises a composition MSi$_x$ including a mixture composition of an MSi$_2$ phase in the form of particles (M: at least one refractory metal selected from a group consisting of W, Mo, Ti, Zr, Hf, Nb and Ta) and an Si phase provided as a matrix phase, and interface layers having a predetermined thickness and formed at the interfaces between the MSi$_2$ phase and the Si phase.

In accordance with one preferred form of the present invention, it is preferable to set X in the composition MSi$_x$ to a value not smaller than 2.0 and not larger than 4.0.

It is also preferable to set the thickness of the interface layers formed at the interfaces between the MSi$_2$ phase and the Si phase to 100 to 5000 Å.

The spatial dispersion of the composition MSi$_x$ may be limited to a range of $\pm 0.05$ in terms of Si/M atomic ratio while the density ratio is set to 99% or greater to enable the sputtering operation to be performed more stably as well as to enable the formation of a thin film having uniform qualities.

The Si phase may contain at least one element selected from a group consisting of B, P, Sb and As and have an electrical resistivity of 0.01 to 1 $\Omega$·cm. Mismatching between electrical resistances of the MSi$_2$ and Si phases is thereby mitigated so that the dispersion of the sputtering rate is reduced, thereby making it possible to obtain a stable film composition.

In accordance with another preferred form of the present invention, the roughness Ra (center line roughness) of a surface portion of the target is set to 0.05 $\mu$m or less, the residual compressive stress in the surface portion is set to 5 kg/mm$^2$ or less. There is therefore substantially no possibility of any work-defect layer having cracks or chipped portions being formed in the target surface portion, and the amount of particles such as those separating and coming off from work-defect layers is remarkably reduced, thereby enabling the formation of a thin film having improved qualities.

In accordance with still another form of the present invention, a target in the form of a plate formed of a refractory metallic silicide represented by a composition formula MSi$_x$ has a composition distribution such that the value of X is increased from a peripheral portion of the target toward the center of the same. It is thereby possible to increase the Si sputtering rate at the center of the target relative to that at the peripheral portion and, hence, to eliminate non-uniformity of the thin film composition, such as that in the case of the conventional method, due to the difference between the sputtering rates of the components at the central and peripheral portions.

It is also possible to change the sputtering speed more smoothly with respect to different regions of the target without impairing the strength of bonding between the $MSi_2$ phase and the Si phase by setting the value of X in the composition formula $MSi_x$ so that X continuously changes in the range of 2.0 to 4.0.

In another aspect of this invention, there is provided a method of manufacturing a sputtering target formed of a refractory metallic silicide having a composition in which an $MSi_2$ phase in the form of particles (M: at least one high melting point metal selected from a group consisting of W, Mo, Ti, Zr, Hf, Nb and Ta) is dispersed in an Si matrix and in which interface layers are formed at the interfaces between the $MSi_2$ phase and the Si phase, the method comprising the steps of:

(1) preparing a mixed powder by mixing an M powder and an Si powder at an Si/M atomic ratio of 2.0 to 4.0;

(2) packing the mixed powder in a mold and rapidly heating up the mixed powder in a high vacuum under a high pressing pressure to form a pressed compact in which an $MSi_2$ phase is synthesized; and (3) sintering the pressed compact at a temperature immediately below the eutectic temperature in a low vacuum or inert gas atmosphere under a high pressing pressure.

In accordance with another preferred form, in the process step (2), a central portion of the mixed powder packed in the mold is rapidly heated up. Si is thereby flows and diffuse from a peripheral portion to the reaction region at the center, thereby obtaining a target having a central portion rich in Si and a peripheral portion rich in refractory metal.

In the process step 92), refractory metal (M) powder and the Si powder may be mixed to prepare at least two mixed powders of different mixing ratios. The mixed powder having a large Si content is packed in a central portion of the mold while the mixed powder having a smaller Si content is packed at the peripheral side of the mold, thereby enabling the Si sputtering rate at the central portion of the target to be increased relative to that at the peripheral portion.

DESCRIPTION OF THE PREFERRED EMBODIMENTS

Figure 1:
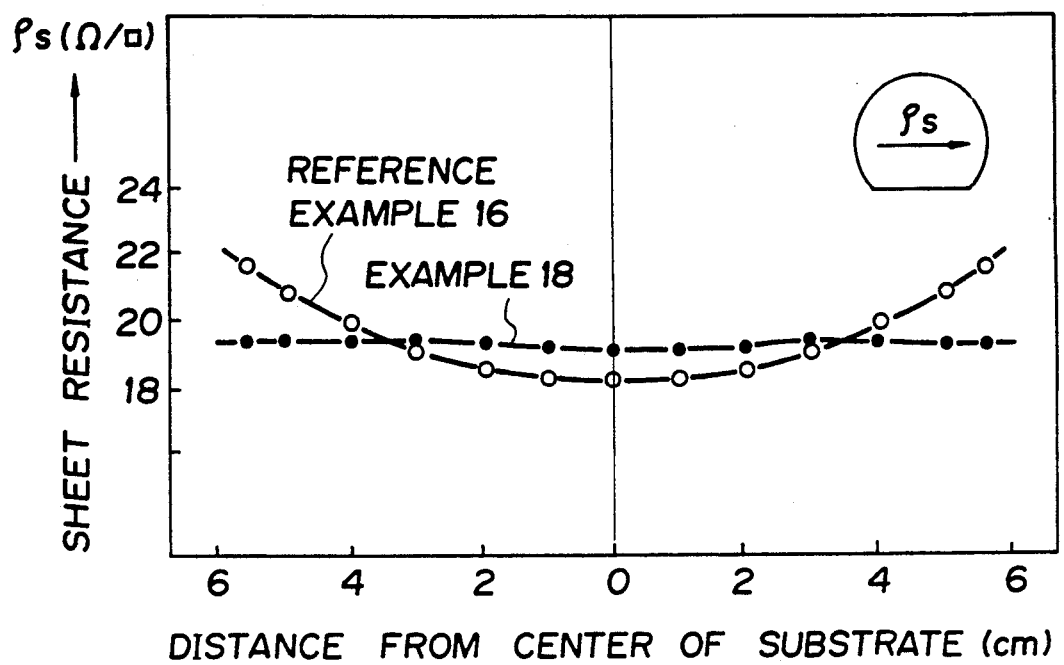
FIG. 1 is a graph of the relationship between the distance from the substrate center and the sheet resistance of each of thin films formed by sputtering using sputtering targets manufactured in accordance with Example 18 of the present invention and Reference Example 16.

According to the inventors' knowledge, to achieve the above-mentioned object, it is necessary for the target to have characteristics based on the following conditions:

① the target is formed of $MSi_x$ ($2.0 \leq X \leq 4.0$) having a mixture composition in which an $MSi_2$ phase in the form of particles uniform in size is dispersed in an Si phase;

② the bonding between $MSi_2$ phase and the Si phase as well as the bonding between $MSi_2$ phase portions is strong;

③ the composition is uniform; the spatial composition dispersion is limited to a range of $\pm 0.05$ (Si/M atomic ratio); and ④ the density ratio is 99% or greater.

Metals, such as molybdenum (Mo), tungsten (W), titanium (Ti), zirconium (Zr), hafnium (Hf), niobium (Nb) and tantalum (Ta), from which a metallic silicide having a small resistivity can be formed are used as the high melting point metal (M) which is a main component of the target; one of these metals or a combination of two or more of them are used.

Each of these metals has a resistivity smaller than those of conventional wiring materials, and has a high corrosion resistance at high temperatures. If a silicide of these metals is used as electrode wiring for semiconductors of a semiconductor arithmetic circuit, the computation speed can be improved. Also these metals are resistant to corrosion due to chemicals applied in a semiconductor manufacturing process and are not easily oxidized by high temperature treatment heat processing.

The inventors have eagerly studied with a view to obtaining a target having the characteristics based on the above conditions ① to ④ and have found that if a mixture of an M powder and an Si powder is reacted, molten and sintered by hot pressing to effect silicide synthesis, sintering and increasing the degree of compactness simultaneously, the high melting point metal (M) is entirely changed into $MSi_2$ and sintered at all temperatures which are equal to or lower than 1300° C. and at which Si is evaporated at a sufficiently high rate; a uniform structure can be obtained in which $MSi_2$ phase portions in the form of particles are surrounded by film-like Si phase portions or, in other words, $MSi_2$ particles are floated like speckles in the Si phase; interface layers in which the impurity density is high are formed at the interfaces between the $MSi_2$ particles and the Si phase so that the interface strength is increased and that the electrical resistance does not changed abruptly; and elimination of pores, improvement in the compactness and increase in the amount of the $MSi_2$ phase are promoted by Si flowage at a temperature which is higher than the eutectic temperature and at which the Si phase is molten. The present invention is essentially based on these findings.

That is, the sputtering target in accordance with the present invention is manufactured by setting the Si molar amount in the mixture powder of M and Si to an amount 2 to 4 times larger than that of M so that X in the composition formula $MSi_x$ is set to a value within a range of $2.0 \leq X \leq 4.0$. In the mixture powder, a major part of the M powder is surrounded by and in contact with the Si powder and is distributed uniformly. This mixture powder is heated while being pressed at a suitable pressure to form a pressed compact, and Si is thereby softened and made to react to M to synthesize $MSi_2$. The temperature of the mixture is locally increased at the positions of contact between Si and M particles by exothermic reaction producing $MSi_2$ to further soften Si, so that Si coheres on the surfaces of particles changing into $MSi_2$, thereby promoting the process of forming $MSi_2$. On the other hand, a large amount of unreacted and superfluous parts of Si softened to a certain degree is forced to flow around particles changing into $MSi_2$ to improve the compactness, so that the $MSi_2$ phase portions in the form of particles are entirely covered with the Si phase in the resulting structure even in the case a composition of $X=2.0$ in which the Si content is small. The $MSi_2$ phase and the Si phase or $MSi_2$ phase portions are therefore bonded together firmly by diffusion reaction, and the spatial dispersion of the composition markedly reduced.

Impurities contained in each phase diffuse and move to the interfaces between the $MSi_2$ phase and the Si phase to form interface layers, thereby increasing the bonding strength of the interfaces between the two phases. If the Si phase is molten to flow, the fluid Si closes each pore remaining in the sintered body to promote increasing the compactness, and the $MSi_2$ phase portions move and combine with each other in the molten Si to grow to a certain size, thereby forming a high density sintered body having a uniform structure in which $MSi_2$ phase portions uniform in particle size are dispersed in the Si phase.

The present invention has been achieved on the basis of this finding.

The present invention will be explained below in more detail.

The refractory silicide target in accordance with the present invention has a structure in which $MSi_2$ phase portions in the form of particles are dispersed in an Si matrix phase. This structure is obtained in such a manner that a powder prepared by mixing an M or $MSi_2$ phase powder and an Si powder so as to set X in the resulting composition $MSi_x$ to a value within a range of $2.0 \leq X \leq 4.0$ is sintered to form an $MSi_2$ phase so that a superfluous part of Si remains around $MSi_2$ phase portions.

The reason for the limitation of the composition $MSi_x$ determined by $2.0 \leq X \leq 4.0$ is as follows. If the value X in the composition $MSi_x$ is smaller than 2.0, a considerable compressive stress is caused in a silicide film formed on a substrate, the adhesion to the substrate is thereby deteriorated, and the film becomes easy to peel off. If the value X in the composition $MSi_x$ exceeds 4.0, the film has a large sheet resistance and is therefore unsuitable for electrode wiring.

During synthesis of $MSi_2$, $MSi_2$ is formed by exothermic reaction caused by the contact between M particles and Si particles and is therefore obtained in the form of particles. The size of the $MSi_2$ particles depends upon the particle size of the M particles, but it may be greatly vary because almost all the M particles exist while cohering together. If the dispersion of the $MSi_2$ particle size is large, the variation in the composition of a silicide film formed by using this target is increased. It is therefore necessary to maximize the degree of particle size uniformity. Preferably, the range of the particle size is 1 to 150 μm. A spherical shape is ideal for the shape of $MSi_2$ particles. This is because a spherical shape is more suitable for preventing the particle from coming off and because there is a strong possibility of particles being formed by abnormal discharge from particles having angular portions. However, M particles obtained by refining based on ion exchange tend to cohere together during the reduction process, and $MSi_2$ particles formed from combined M particles have large irregularities. It is therefore necessary to process the M particles under reduction conditions suitable for limiting cohesion or to add a dispersant to limit cohesion when the particles are mixed. Instead of this method, a chemical vapor deposition method may preferably be used to form M particles having improved dispersibility.

Chemical vapor deposition methods (hereinafter referred to simply as "CVD") are based on a process in which a raw material such as a halide, a sulfide or a hydride is set in a vapor phase state at a high temperature and undergoes chemical reaction including thermal decomposition, oxidation and deoxidation, and the reaction product is deposited on a substrate. CVD methods are used as methods in various fields to form semiconductors and insulating films.

Raw-material M and Si powders necessarily contain impurities and dopes which cannot be removed by the present manufacturing methods.

Specifically, dopes such as B, P, Sb and As are ordinarily mixed in M powders and Si powders provided as raw materials of targets for manufacturing semiconductors. If a target is formed by using raw materials containing such dopes, the dopes are diffused and concentrated at a particular portion, e.g., crystalline interfaces by the heat of reaction and sintering. At this time, the dopes act to disturb the lattice or move to the interfaces between the $MSi_2$ phase and the Si phase where a lattice distortion exists, thereby forming interface layers. Preferably, the thickness of the interface layers is set to 100 to 5000 Å although the preferred thickness depends upon the amount of dopes contained in the M and Si particles. The thickness of the interface layers is ordinarily detected by a micro-Auger emission spectroscopy (μ-AES). That is, Auger analysis is conducted by radiating an electron beam to a target formed of different chemical phases with an interface layer interposed therebetween, thereby obtaining two linear spectral base lines of energy levels corresponding to the respective chemical phase and a spectral curve connecting the two spectral base lines. The region in which this spectral curve appears corresponds to the interface layer. Accordingly, the thickness of the interface layers in accordance with the present invention is obtained as the distance between points of intersection of the two spectral base lines and the line tangent to the spectral curve at the inflection point thereof.

If such interface layers exists, the strength of bonding of the $MSi_2$ and Si phases is improved and the possibility of $MSi_2$ phase portions coming off from Si matrix portions is reduced. Also, if interface layers of a high impurity density are formed at the interfaces between an $MSi_2$ phase having a low resistance and an Si phase having a high resistance, the resulting structure is free of any abrupt change in the electrical resistance, and there is no possibility of any abnormal discharge during sputtering. The interface layers are effective in these respects.

To set the thickness of the interface layers more than 5000 Å, a considerable amount of dopes must be contained in the Si phase. In such an event, the resulting silicide film is contaminated with impurities. If the thickness of the interface layers is less than 100 Å, the above-described effects cannot be fully ensured.

The spatial dispersion of the composition of the target can be reduced to limit the variation in the film composition and to obtain a silicide film having a uniform composition. It is preferable to limit the dispersion to a range of ±0.5 in terms of Si/M atomic ratio.

The density ratio of the target relates to the amount of coming-off particles. If the density is low, many pores exist in the target, and there is a strong possibility of occurrence of abnormal discharge at the corresponding positions and, hence, the possibility of target portions breaking and coming off. It is therefore preferable to set the density ratio of any portion of the target to 99% or greater.

The inventors of the present invention have also studied eagerly with a view to reducing the rate at which the electrical resistance abruptly changes at each interface between the $MSi_2$ phase and the Si phase and have found that a target obtained by sintering an Si powder and an M or $MSi_2$ powder containing at least one of B, P, Sb and As and prepared to set the desired electrical resistance has a structure which is improved in matching between the $MSi_2$ phase and the Si phase and therefore has a uniform sputtering speed and which is free from any abrupt change in the electrical resistance and has an increased interface strength by the effect of the formation of diffusion layers at the interfaces between the $MSi_2$ phase and the Si phase in which layers the above element is diffused.

A sputtering target in accordance with one preferred embodiment of the present invention has been made on the basis of the above-described findings. More specifically, it is formed of a refractory metallic silicide having an $MSi_x$ ($2.0 \leq X \leq 4.0$) composition based on a mixture of an $MSi_2$ phase (M: at least one refractory metal selected from a group consisting of W, Mo, Ti, Zr, Hf, Nb and Ta) and an Si phase, and the Si phase contains at least one element selected from a group consisting of B, P, Sb and As and has an electrical resistivity of 0.01 to 1Ω·cm.

B, P, Sb and As are elements having an effect of greatly reducing the electrical resistance of the Si phase. If the Si phase of the target contains these elements, the electrical resistances of the two phases can be matched with each other, and the sputtering rate is thereby made uniform, resulting in a stable film composition and a uniform film thickness. The elements in the Si phase diffuse and move to the interfaces between the $MSi_2$ phase and the Si phase where the extent of disturbance of the lattice and the lattice distortion are large to form the above-mentioned interface layers.

The thickness of the interface layers is set to about 100 to 5000 Å although it varies depending upon the amounts of elements contained in the Si phase.

If the resistivity of the Si phase is smaller than 0.01Ω·cm, the electrical resistances of the $MSi_2$ phase and the Si phase are mismatched so that the sputtering rate is locally non-uniform, resulting in failure to obtain a stable film composition. If the resistivity exceeds 1.0Ω·cm, the above-described effects cannot be fully ensured. It is therefore preferable to set the electrical resistivity of the Si phase to a range of 0.01 to 1.0Ω·cm or, more preferably, 0.02 to 0.2Ω·cm.

The inventors have also found that the separation of particles from the target during sputtering also depends upon surface defective layers formed during finish-machining of the sintered silicide body, e.g., grinding, the state of the surface or a residual stress resulting from the same. The conventional grind-finish working for the target is based on grinding the worked object with a hard abrasive grains of a grinding wheel rotating at a high speed. If a hard and brittle material such as a sintered silicide body consisting of a disilicide of a refractory metal (e.g., $WSi_2$) and silicon is ground by this means, powdery chips are necessarily scattered from the worked surface. According to the inventors' knowledge, such powdery chips are formed in such a manner that very fine cracks are formed in the ground surface by the stress caused by the contact with abrasive grains during grinding, and the edge portions of the cracks are displaced upward and separated as fragments by the abrupt decrease in the stress after the abrasive grains have passed. Ordinarily, for working of brittle materials, the cutting depth or load for each abrasive grain is suitably increased so that cracks are included in local stress fields caused by the abrasive grains, and the working is progressed with accumulation of fine fragments of the material. For this reason, a multiplicity of work-defect layers having grinding streaks, coming-off holes, fine cracks and the like are formed in the grinding surface.

If sputtering is effected by using a target in which such defect layers are formed over the whole surface, fine particles separate and come off from the target surface as the above-mentioned separated particles by breaking at such defect portions by collision of ions in the plasma.

A sputtering target in accordance with another preferred embodiment of the present invention has been made on the basis of the above-described findings and is basically characterized in that the roughness Ra (center line roughness) of a surface portion of the target is set to 0.05 μm or less and there is substantially no possibility of formation of any work-defect layers having fine cracks and chipped portions formed by machining.

The surface roughness Ra (center line roughness) referred to herein is as defined in Japan Industrial Standard (JIS-B0601). That is, a portion of a roughness curve having a measurement length l in the direction of the center line is extracted, the X axis set to the center line of the extracted portion, the Y axis is set to the direction of the longitudinal magnification, and the roughness curve is represented by y=f(x). Then, the surface roughness Ra is expressed as a value in micrometers (μm) obtained by the following equation:

$$Ra = \frac{1}{l} \int_0^l |f(x)| dx$$

To reduce the finished surface roughness and to substantially entirely remove any work-defect layers in which clacks and coming-off holes are formed, it is important to reduce the working unit relative to the distribution of material defects. More specifically, it is necessary to use abrasive grains having a smaller and uniform grain size or to reduce the load per abrasive gain by using a means such as a soft polisher improved in elasticity or viscoelasticity to limit the stress caused in the material to a value lower than the breaking stress.

Even in the case of a hard and brittle material such as a refractory metallic silicide, there is a certain working range in which the material exhibits a plastic-flow deformation alone and is free from cracking provided that the load is extremely small. It is thereby possible to finish the worked surface to make the same a glossy surface with extremely small irregularities. For this working, lapping or polishing for surfacing or mechano-chemical polishing for super-high-precision finishing may preferably be used.

Mechano-chemical polishing is high-precision polishing based on the two different conventional processes: mechanical polishing using a grinding stone; and chemical polishing utilizing a process of finely eroding the polished material surface with a chemical.

In practice, however, it is difficult to finish the sintered silicide body in conformity with the desired size. There is therefore a need for a process in which the material surface is first worked by efficient surface working such grinding and is then worked by lapping or polishing to remove work-defect layers formed by the preceding working.

The above kinds of surface working are graded in terms of abrasive grain size in the order of lapping, polishing and mechano-chemical polishing, and the size of abrasive grains used in mechano-chemical polishing is the smallest. The finished surface roughness also becomes finer in this order. If these kinds of working are utilized for refractory metallic silicide target, the amount of separated particles can be remarkably reduced. That is, according to the inventors' knowledge, there is a correlation between the amount of separated particles and the surface roughness, and it is particularly preferable to limit the surface roughness Ra (center line roughness) to 0.05 μm or less for the purpose of limiting the amount of separated particles having a size such that the separated particles causes electrode wiring defects.

During sputtering based on Ar ion irradiation, a high stress field is caused in the target at an ion collision point, and the target surface is heated at a high temperature. If residual stresses remain in surface portions of the target while being distributed non-uniformly, the stresses are re-distributed by the heat produced during sputtering so as to be locally increased, and large cracks including radical cracks are thereby caused, resulting in a considerable increase in the amount of separated particles. In this respect, it is particularly preferable to limit the residual stress to 5 kg/mm$^2$ or less.

The inventors have also studied with a view to eliminating any non-uniformity of the thin film composition due to the difference between the sputter release angle distributions of the respective components of the target, and have confirmed that in a case where a sintered body is manufactured by hot-pressing a mixture of a refractory metal (M) powder and a silicon (S) powder to effect silicide synthesis, sintering and increasing the compactness at the same time, reaction of forming a disilicide phase of refractory metal (MSi$_2$) is effected by filling the interior of a mold for forming the target with the powder mixture and by rapidly heating a central portion thereof under a high pressure condition, and Si is thereby made to flow and diffuse from a peripheral portion to the central reaction region, so that a target having a central portion rich in Si and a peripheral portion rich in the high melting point metal is formed. This target has a composition distribution reverse to that of the conventional target in which the peripheral portion is rich in Si while the central portion is rich in refractory metal.

It has also been found that the width of the region in which the composition is changed (composition gradient) can be freely controlled by selecting the heating speed of the rapid heating.

The powder mixture packed in the mold is rapidly heated at its central portion by while being pressed at a suitable pressure, and Si is thereby softened and is reacted with M to form a disilicide of refractory metal (MSi$_2$). Since this disilicide synthesis reaction of forming MSi$_2$ is an exothermic reaction, the central portion of the body to be formed as the target in which Si particles and M particles are in contact with each other is locally heated up and is thereby further softened to be fluidized, and Si particles in the peripheral portion diffuse and move to the reaction region at the central portion. Raw material particles other than the raw material particles changing into MSi$_2$ cohere together on the surfaces and the peripheries of the latter to promote the MSi$_2$ production.

On the other hand, a large amount of unreacted and superfluous part of Si softened to a certain degree is force to flow to the peripheries of the particles changing into MSi$_2$ to increase the degree of compactness. The amount of Si phase located around the MSi$_2$ phase is large at the silicide reaction start point and is reduced toward the reaction end point.

As a result, a region of a composition rich in Si at its central portion corresponding to the center of the mold and rich in refractory metal at its peripheral portion is formed. The resulting target therefore has an overall composition gradient such that the Si content is continuously changed from a peripheral portion of the target toward a central portion of the same.

That is, a sputtering target relating to claim 8 is a target in the form of a plate consisting of a refractory metallic silicide represented by a composition formula MSi$_x$ (M: at least one refractory metal selected from a group consisting of W, Mo, Ti, Zr, Hf, Nb and Ta) and having a composition distribution such that the value of X increases from a peripheral portion of the target to a central portion of the same.

The sputtering speed can be changed more smoothly with respect to different sputtering regions of the target without impairing the strength of bonding between the MSi$_2$ phase and the Si phase if X in the composition MSi$_2$ is set so as to be continuously changed within a range of 2.0 to 4.0.

The composition of the target may also be set in such a manner that it consists of a refractory metallic silicide represented by a composition formula MSi$_x$ and has a distribution in which the value of X is within a range of 2.0 to 4.0 and is continuously reduced from a central portion of a region to be eroded by sputtering toward an outer peripheral portion of this region. It is possible to increase the Si sputtering rate at the central portion of the target relative to that at the peripheral portion by adopting this structure and hence to eliminate any non-uniformity of the thin film composition due to the difference between the sputtering speeds of the respective components at the peripheral and central portions as in the case of the conventional method.

Next, the manufacturing method of the present invention will be described concretely.

In the step (1) of the above-described manufacturing method, the M powder and the Si powder are blended and mixed so that the Si/M atomic ratio in the composition of the mixture is set to 2.0 to 4.0.

High purity M and Si powders are used as raw material powders. In particular, for the manufacture of a target having improved qualities and used in the electronic industry, it is desirable to use high purity materials in which the oxygen impurity content is small and in which the contents of radioactive elements, such as U and Th, alkali metals, such as Na and K, and heavy metals, such as Fe, Ni and Cr are particularly small.

The raw material M and Si powders are prepared to be blended at a Si/M atomic ratio of 2.0 to 4.0, and are mixed sufficiently uniformly in a dry mixing manner by using a ball mill or V-type mixer. If they are not uniformly mixed, the structure and the composition of the target become non-uniform and the properties of the resulting film are deteriorated, which is undesirable.

It is suitable to blend an amount of Si slightly excessive as compared with that determined by the desired composition in consideration of vapor-loss of Si from Si powder surfaces and $SiO_2$ of the oxide film during high temperature heating. The proportion of the superfluous part is small, e.g., 5% and may be determined empirically in consideration of the temperature, the time and the pressures for processing in subsequent steps.

The average particle size of the raw material M and Si powders is within a range of 1 to 30 μm. However, for improvement in the compactness of the sintered body as well as for making the mixture uniform, it is preferable to limit the average particle size of the M powder to at most ¼ of that of the Si powder.

In the process step (2), the disilicide phase ($MSi_2$ phase) is synthesized by rapidly heating the mixed powder prepared in the step (1) in a below-mentioned high vacuum at a high pressing pressure.

The silicide synthesis is effected in a high vacuum. It is preferable to set the vacuum to $5 \times 10^{-4}$ Torr or less in order to promote release of the absorbed gas. However, if the interior of the hot pressing unit is abruptly vacuumized, particles of the mixture powder fly and scatter from the mold, resulting in failure to sufficiently increase the degree of compactness of the sintered body. It is therefore preferable to gradually increase the degree of vacuum until the internal pressure of the hot pressing unit becomes 100 Torr or less.

The hot-press pressure is required for increasing the degree of compactness of the sintered body and is, preferably, 50 to 500 kg/cm². If the pressure is lower than 50 kg/cm²k, many pores remain in the sintered body to reduce the density thereof, and the degree of flowage of Si is insufficient, resulting in failure to achieve the desired uniformity of the structure. If the pressing pressure exceeds 500 kg/cm², the density of the sintered body is increased but the possibility of the mold being broken is increased.

It is preferable to set the temperature at which the material is heated during pressing to a range of 600° to 800° C. in order to optimize the gas release.

It is preferable to set the heating rate at which the temperature of the powder mixture is increased to 10° to 50° C./min. in order to suitably control the size of the synthesized $MSi_2$ phase. If the heating rate is smaller than 10° C./min., the $MSi_2$ phase is very small and the sputtering efficiency at the time of film formation is deteriorated. If the heating rate is larger than 50° C./min., the possibility of the mold and/or the sintered body being broken by an abrupt change in the calorific power is increased. Temperatures not higher than 1350° C. are suitable for heating, or more preferably, the heating temperature is not higher than 1300° C. because the composition error due to Si vapor-loss becomes greater with increase in the temperature. However, the heating temperature is 1250° C. or lower in a case where titanium (Ti) is used as refractory metal (M).

The process step (3) is a sintering step in which the material is heated in a low vacuum or an inert gas atmosphere under high pressing pressure to a temperature immediately below the eutectic temperature to strengthen and improve the interface bonding between the $MSi_2$ phase and the Si phase.

Sintering is effected at a temperature equal to or higher than 1300° C., and there is therefore a risk of the Si vaporization rate being greatly increased and, hence, a risk of composition error being increased. It is therefore preferable to set the degree of vacuum to at most $10^{-3}$ Torr, or introduce a high purity Ar inert gas into the furnace. The use of nitrogen gas ($N_2$) is not preferably because $N_2$ and Si powder may form $Si_3N_4$.

The pressing pressure may be equal to that in the case of the process step (2) for effecting the disilicide synthesis. However, if the pressure is increased during sintering, the sintered body is cracked. It is therefore preferable to constantly maintain the pressing pressure after the silicide synthesis.

It is preferable to set the hot-press temperature T to a temperature immediately below the eutectic temperature Ts, i.e., to a range of $Ts-50 \leq T < Ts$. The eutectic temperatures Ts with respect to W, Mo, Ti and Ta used as the high melting point metal M are respectively 1400°, 1410°, 1330° and 1385° C. If T is lower than Ts—50, the sintering time for increasing the strength of the interface between the $MSi_2$ phase and the Si phase is long. If T is equal to or larger than Ts, the Si phase is molten and, if the pressing pressure is high under this condition, the molten silicon flows out of the mold, resulting in an increase in the error in the setting of the composition of the sintered body.

It is suitable to continue the sintering for 0.5 to 8 hours. If the sintering time is shorter than 0.5 hour, many pores are left and the interface bonding strength of the sintered body is insufficient. If the sintering time is longer than 8 hours, the manufacturing efficiency is reduced because the compactness of the sintered body is not substantially improved after 8 hours.

To further improve the compactness, the following additional step may be provided after the step (3).

In the additional step, the interior of the hot pressing unit is maintained in a low vacuum of at most $10^{-3}$ Torr or in a high purity Ar gas atmosphere for the purpose of preventing evaporation of Si, the material is heated up to a temperature immediately above the eutectic temperature to maintain the Si phase in a molten state and to thereby increase the density of the sintered body and the size of the $MSi_2$ phase.

Preferably, the pressing pressure in this additional step is maintained at a range of 20 to 50 kg/cm². If the pressure is lower than 20 kg/cm², bulging is caused by the internal pressure of the molten Si in the sintered body. If the pressure is higher than 50 kg/cm², the sintered body has a composition different from the desired composition owing to the flowage of the molten Si.

Preferably, the pressing temperature T in the additional step is set to a temperature immediately above the eutectic temperature. More specifically, it is set to a range of $Ts < T \leq Ts+50$. If $T < Ts$, the Si phase is not molten and any substantial increase in the degree of compactness based on elimination of pores as well as increase in the size of the $MSi_2$ phase based on combination of $MSi_2$ portions cannot be expected. If $T \geq Ts+50$, the $MSi_2$ phase is molten again so that the proportion of the molten part is excessively increased, and the possibility of the molten part flowing out of the mold is increased, which is undesirable. In a case where Ti is used as the refractory metal M, the composition at the eutectic point is such that the ratio of the weights of Ti and Si is 78:22 and the proportion of molten Si is larger as compared with other elements W, Mo and Ta. It is therefore difficult to control the Si flowing-out loss by means of the control of the pressing pressure. In this case, it is desirable to omit the additional step.

In the process step (2) in accordance with another preferred embodiment, a central portion of the mixed powder packed in the mold is heated to cause a reaction of forming the disilicide phase of the refractory metal M ($MSi_2$), and the Si component flows and diffuses from a peripheral portion of the target to the central reaction region, thereby obtaining a target having a central portion rich in Si and a peripheral portion rich in the high melting point metal.

In the process step (2) in accordance with a still another preferred embodiment, at least two different powder mixtures prepared by mixing the refractory metal (M) powder and the Si powder at different mixture ratios are packed in such a manner that the powder mixture having a larger Si content is packed in a central portion of the mold and the powder mixture having a smaller Si content is packed an outer peripheral portion, thereby obtaining a sputtering target having a central portion rich in Si and an outer peripheral portion rich in the high melting point metal.

Preferably, in the case where powder mixtures having different mixture ratios (Si/M) are packed in the mold, the mixture ratio of the powder mixture placed at the center of the mold corresponding to an eroded region of the target is set to 2.5 to 4.0 while the mixture ratio of the powder mixture placed at the outer peripheral side is set to 2.0 to 3.5, and the difference between these ratios is set to 1.0 or less.

This setting of the ranges of mixture ratios at the central and the outer periphery ensures that the metallic silicide thin film formed by using this target can be prevented from peeling off while the electrical resistance of the thin film is limited. Also the above setting of the difference between the ratios ensures that the uniformity of the composition of the thin film can be improved.

The composition in accordance with the present invention and the effects of the same will be described below in more detail with respect to examples thereof.

EXAMPLES 1 TO 14

Examples 1 to 14 of the present invention were manufactured in the following manner. A high purity M powder having an average particle size of 5 $\mu$m and a high purity Si powder having an average particle size of 15 $\mu$m and doped with B, P, Sb or As were blended at a Si/M atomic ratio of 2.6 to 2.8 and were mixed in a dry mixing manner for 72 hours by a ball mill displaced by a high purity Ar gas. The mixed powder was packed in a hot pressing mold formed of high purity graphite, was set in a vacuum hot pressing unit, and was degassed in a vacuum of $5 \times 10^{-5}$ Torr at a temperature of 600° C. for two hours.

Next, the material was pressed at 250 kg/cm$^2$ and was heated to 1250° C. at a temperature increase rate of 30° C./min. to synthesize a disilicide ($MSi_2$), and the degree of vacuum in the furnace was thereafter reduced to $2 \times 10^{-2}$ Torr, followed by sintering at 1320° to 1380° C. for 2 hours.

The sintered body thereby obtained was ground and polished and was worked by electrical discharge machining to finish a target having a diameter of 260 mm and a thickness of 6 mm.

REFERENCE EXAMPLES 1 TO 14

Reference Examples 1 to 14 were manufactured in the following manner. A high purity M powder having an average particle size of 5 $\mu$m and a high purity Si powder having an average particle size of 30 $\mu$m were mixed so that the Si/M atomic ratio of the composition was 2.5 to 2.6. The mixed powder was not pressed under the following conditions:

hot-press temperature: 1380° C.
hot-press pressure: 250 kg/cm$^2$
holding time: 2 hours to form a target having a conventional structure and having a diameter of 260 mm and a thickness of 6 mm.

The properties of the targets obtained as the Examples 1 to 14 and Reference Examples 1 to 14 were measured including the average thickness of interface layer, the density ratio, the composition ratio, the dispersions of these quantities and the flexure strength. Table 1 shows the results of these measurements. As can be understood from Table 1, it was confirmed that the $MSi_2$ phase and the Si phase of the targets in accordance with Examples 1 to 14 of the present invention were firmly bonded together because these examples had a uniform high-density structure in which the composition dispersion was small and also exhibited a high flexure strength. A section of the structure of each of Examples 1 to 14 targets was observed with an optical microscope. As a result, the obtained structure was uniform in which $WSi_2$ particles uniform in size were buried in the Si phase.

Each of the targets formed as Examples 1 to 14 and Reference Examples 1 to 14 was set in a magnetron sputtering unit and sputtering was effected under a condition of an argon pressure of $2.5 \times 10^{-3}$ Torr, thereby depositing a tungsten silicide film having a thickness of about 3000 Å on a sapphire substrate. The same process was repeated 10 times, and the dispersion of the film composition and the amount of mixed particles having a size of equal to or larger than 0.5 $\mu$m were measured. Table 1 also shows the results of these measurements. As is apparent from Table 1, the film composition was stable and the amount of particles was small. It is thereby understood that a remarkable improvement in yield can be expected if the target in accordance with the present invention is used for forming an electrode wiring of a semiconductor device.

TABLE 1

| | | | | Target | | | | Formed film | |
|---|---|---|---|---|---|---|---|---|---|
| | | Si powder | | Average | | | | | |
| Example No. | M powder or $MSi_2$ powder | Dope | Electrical resistivity ($\Omega \cdot$ cm) | thickness of interface layer (Å) | Density ratio (%) | Composition Ratio (Si/M atomic ratio) | Flexure strength (kg/mm$^2$) | Composition ratio (Si/M atomic ratio) | Amount of particles (No.) |
| Examples of the invention | | | | | | | | | |
| 1 | W | B | 0.1 | 1580 | 99.5 ± 0.3 | 2.59 ± 0.02 | 46 | 2.62 ± 0.01 | 20 |

TABLE 1-continued

| | | Si powder | | Target | | | | Formed film | |
|---|---|---|---|---|---|---|---|---|---|
| Example No. | M powder or MSi₂ powder | Dope | Electrical resistivity (Ω·cm) | Average thickness of interface layer (Å) | Density ratio (%) | Composition Ratio (Si/M atomic ratio) | Flexure strength (kg/mm²) | Composition ratio (Si/M atomic ratio) | Amount of particles (No.) |
| 2 | W | P | 0.08 | 1720 | 99.6 ± 0.2 | 2.68 ± 0.02 | 45 | 2.70 ± 0.01 | 18 |
| 3 | Mo | P | 0.2 | 1520 | 99.6 ± 0.3 | 2.59 ± 0.02 | 44 | 2.63 ± 0.01 | 22 |
| 4 | Mo | Sb | 0.3 | 1500 | 99.7 ± 0.1 | 2.67 ± 0.02 | 43 | 2.68 ± 0.01 | 24 |
| 5 | Ti | B | 0.05 | 2500 | 99.4 ± 0.2 | 2.59 ± 0.02 | 42 | 2.63 ± 0.01 | 12 |
| 6 | Ti | As | 0.08 | 2300 | 99.6 ± 0.2 | 2.57 ± 0.02 | 41 | 2.59 ± 0.01 | 15 |
| 7 | Ta | B | 0.2 | 1630 | 99.4 ± 0.3 | 2.69 ± 0.02 | 45 | 2.72 ± 0.01 | 23 |
| 8 | Ta | P | 0.1 | 1340 | 99.5 ± 0.3 | 2.77 ± 0.02 | 43 | 2.80 ± 0.01 | 20 |
| 9 | Zr | P | 0.05 | 3500 | 99.3 ± 0.1 | 2.61 ± 0.02 | 44 | 2.63 ± 0.01 | 13 |
| 10 | Zr | Sb | 0.15 | 1280 | 99.4 ± 0.2 | 2.68 ± 0.02 | 43 | 2.70 ± 0.01 | 25 |
| 11 | Hf | B | 0.2 | 1200 | 99.5 ± 0.3 | 2.60 ± 0.02 | 47 | 2.62 ± 0.01 | 18 |
| 12 | Hf | P | 0.8 | 850 | 99.4 ± 0.3 | 2.70 ± 0.02 | 45 | 2.92 ± 0.01 | 27 |
| 13 | Nb | P | 0.1 | 1210 | 99.6 ± 0.2 | 2.59 ± 0.02 | 46 | 2.61 ± 0.01 | 22 |
| 14 | Nb | Sb | 0.5 | 980 | 99.5 ± 0.2 | 2.69 ± 0.02 | 44 | 2.71 ± 0.01 | 25 |
| Reference Examples | | | | | | | | | |
| 1 | W | — | | 23000 | 99.4 ± 0.3 | 2.67 ± 0.02 | 36 | 2.70 ± 0.02 | 155 |
| 2 | Mo | — | | " | 99.5 ± 0.2 | 2.58 ± 0.02 | 38 | 2.63 ± 0.02 | 165 |
| 3 | Ti | — | | " | 99.5 ± 0.3 | 2.62 ± 0.02 | 39 | 2.65 ± 0.02 | 162 |
| 4 | Ta | — | | " | 99.3 ± 0.2 | 2.57 ± 0.02 | 37 | 2.60 ± 0.02 | 175 |
| 5 | Zr | — | | " | 99.4 ± 0.3 | 2.60 ± 0.02 | 37 | 2.63 ± 0.02 | 158 |
| 6 | Hf | — | | " | 99.3 ± 0.2 | 2.59 ± 0.02 | 36 | 2.63 ± 0.02 | 177 |
| 7 | Nb | — | | " | 99.5 ± 0.3 | 2.60 ± 0.02 | 38 | 2.65 ± 0.02 | 182 |
| 8 | WSi₂ | — | | " | 96.5 ± 2.1 | 2.50 ± 0.10 | 29 | 2.69 ± 0.08 | 650 |
| 9 | MoSi₂ | — | | " | 95.8 ± 2.7 | 2.47 ± 0.11 | 26 | 2.66 ± 0.07 | 585 |
| 10 | TiSi₂ | — | | " | 95.0 ± 2.3 | 2.51 ± 0.08 | 26 | 2.67 ± 0.06 | 493 |
| 11 | TaSi₂ | — | | " | 94.8 ± 2.5 | 2.60 ± 0.09 | 28 | 2.78 ± 0.07 | 722 |
| 12 | ZrSi₂ | — | | " | 96.5 ± 2.0 | 2.58 ± 0.10 | 27 | 2.60 ± 0.05 | 588 |
| 13 | HfSi₂ | — | | " | 95.6 ± 2.0 | 2.57 ± 0.12 | 25 | 2.63 ± 0.06 | 602 |
| 14 | NbSi₂ | — | | " | 93.4 ± 2.6 | 2.59 ± 0.13 | 24 | 2.62 ± 0.08 | 745 |

EXAMPLE 15 a sintered silicide body (tungsten silicide) formed by hot pressing was cut by wire electrical discharge machining to have a diameter of 258 mm and was ground to have a thickness of 6 mm by employing a vertical-axis rotary surface grinder with a grinding wheel SD270J55BW under conditions: grinding wheel peripheral speed of 1200 m/min.; a table rotating speed of 12 rpm; and a paring speed of 10 μm/min.

A backing plate was thereafter soldered to the surface opposite to the worked surface, and the surface to be polished was worked with a lens polisher and 15 μm diamond abrasive grains for 60 hours, and was then worked by lapping with 3 μm abrasive grains for 10 hours. An ultrasonic cleaner was used to remove the working solution attached to the lapped surface, and the surface was thereafter degreased by acetone and was dried, thereby being finished.

The worked surface was observed with a scanning electron microscope (SEM). As a result, no grinding streaks or coming-off holes caused by grinding remained, and no fine cracks caused by the deformation-breaking action of the abrasive gains were recognized. It was thereby confirmed that work-defect layers were removed.

The roughness of the worked surface was observed with a surface roughness measuring apparatus (Talysurf), and the residual stress in the worked surface was measured with an X-ray stress measuring apparatus on the basis of a parallel-inclination method. Table 2 shows the results of these measurements. The results of the corresponding measurements of a ground surface are also shown as Reference Example 15 in Table 2.

This target was set in a magnetron sputtering unit and sputtering based on Ar ion irradiation was effected to deposit a silicide film having a thickness of 3000 Å on a polysilicon substrate. The amount of particles mixed in this film was measured. The result of this measurement is shown in Table 2. The result of the corresponding measurement of the ground surface is also shown as Reference Example 15 in Table 2. As is apparent from Table 2, it was found that the amount of particles in the film formed by using the target in accordance with Example 15 was greatly reduced and that the amount of particles separated during sputtering could be reduced by the effect of lapping.

EXAMPLE 16

A sintered silicide body having a diameter of 258 mm was ground and lapped in the same manner as Example 15 and was then polished with an acrylic resin polisher and 0.3 μm cerium oxide abrasive grains for 10 hours under conditions: polisher pressure of 1 kg/cm²; and polisher speed of 10 m/min. The working solution was removed by ultrasonic cleaning, and the polished surface was thereafter degreased by acetone and was dried, thereby finishing a target.

As a result of observation of the worked surface with an SEM, work-defect layers having grinding streaks, coming-off holes and fine cracks caused by grinding were completely eliminated, and the surface was finished in a specular state. The results of measurements of the surface roughness and the residual stress in the worked surface are shown in Table 2. Irregularities in the worked surface were extremely small as compared with the ground surface shown as Reference Example 15, and plastic or elastic deformations of in the surface caused by grinding were removed almost entirely.

Magnetron sputtering was effected by using this target to form a silicide film on a polysilicon substrate. The result of measurement of the amount of particles mixed in this film is shown in Table 2. As is also apparent from this result, it was confirmed that the amount of particles separated from the target could be remarkably reduced by the effect of improvements in the properties of the surface attained by polishing performed as final finishing.

EXAMPLE 17

A sintered silicide body having a diameter of 258 mm was ground and lapped in the same manner as Example 15 and was then polished in a mechano-chemical polishing manner with a cloth polisher and 0.02 μm $SiO_2$ powder for 20 hours under conditions: polisher pressure of 1 kg/cm$^2$; and polisher speed of 10 m/min. After ultrasonic cleaning, the polished surface was degreased by acetone and was dried, thereby finishing a target.

As a result of SEM observation of the worked surface, no work-defect layers caused by grinding were recognized, and the degree of smoothness was extremely high as compared with the ground surface with respect to the surface roughness and the residual stress, and the worked surface was equivalent to a non-distortion surface.

Magnetron sputtering was effected by using this target to form a silicide film on a polysilicon substrate. The amount of particles having a diameter equal to or larger than 0.5 μm and mixed in this film was measured. As a result, substantially no particles were recognized, as shown in Table 2, and it was confirmed that any work-defect layers and residual stresses causing separation of particles could be completely removed by the final finishing.

TABLE 2

| | Surface roughness Ra (μm) | Residual compressive stress (kg/mm$^2$) | Amount separated particles (No.) |
|---|---|---|---|
| Example 15 | 0.012 | 2.7 | 25 |
| Example 16 | 0.008 | 1.6 | 17 |
| Exmaple 17 | 0.002 | 0.8 | 10 |
| Reference Example 15 | 0.73 | 13.8 | 280 |

EXAMPLE 18

Example 18 of the present invention was manufactured in the following manner. A high purity W powder having an average particle size of 5 μm and a high purity Si powder having an average particle size of 15 μm were blended at a mixing ratio (Si/W) of 2.8 in terms of atomic ratio and were mixed in a dry mixing manner for 72 hours by a ball mill displaced by a high purity Ar gas.

The mixed powder was then packed in a hot pressing mold formed of high purity graphite, was set in a vacuum hot pressing unit, and was degassed in a vacuum of $5 \times 10^{-5}$ Torr at a temperature of 600° C. for two hours.

Next, the powder mixture was pressed at 250 kg/cm$^2$ and a central portion of the same was heated to 1300° C. at a temperature increase rate of 30° C./min. to synthesize a tungsten disilicide ($WSi_2$), and the degree of vacuum in the furnace was thereafter reduced to $2 \times 10^{-2}$ Torr, followed by sintering at 1380° C. for 2 hours.

The sintered body thereby obtained was ground and polished and was worked by electrical discharge machining to finish a target having a diameter of 260 mm and a thickness of 6 mm.

REFERENCE EXAMPLE 16

Reference Example 16 was manufactured by the conventional manufacture method in the following manner. A $WSi_2$ powder having an average particle size of 30 μm and an Si powder having an average particle size of 30 μm were uniformly mixed so that the mixing ratio (Si/W) in terms of atomic ratio was 2.8. The mixed powder was hot pressed under the following conditions:
hot-press temperature: 1380° C.
hot-press pressure: 250 kg/cm$^2$
holding time: 2 hours
to form a target having a diameter of 260 mm and a thickness of 6 mm.

Each of the targets obtained as the Example 18 and Reference Example 16 were set in a magnetron sputtering unit and sputtering was effected under a decompressed condition of an argon pressure of $2.3 \times 10^{-3}$ Torr, thereby depositing a tungsten silicide thin film having a thickness of about 3000 Å on a 5-inch silicon wafer (substrate). The sheet resistance ρs of the obtained silicide thin film was measured by a pole-dipole array method. FIG. 1 shows the results of this measurement.

As is apparent from the results shown in FIG. 1, the sheet resistance ρs of the tungsten silicide thin film formed by using the target in accordance with Example 18 was substantially constant over the whole region between the center and the periphery of the substrate unlike the conventional thin film formed by using Reference Example 16. It was thereby proved that the present invention enables a uniform thin film composition distribution.

According to these results, it is possible to provide high quality semiconductor products having uniform characteristics by using the target of the present invention to form electrode wirings of the semiconductor devices.

EXAMPLE 19

Example 19 of the present invention was manufactured in the following manner. A high purity Mo powder having an average particle size of 3 μm and a high purity Si powder having an average particle size of 15 μm were blended at a mixing ratio (Si/Mo) of 2.8 in terms of atomic ratio and were mixed in a dry mixing manner for 72 hours by a ball mill in the same manner as Example 18, thereby preparing an uniform powder mixture. Next, the mixed powder was packed in a mold and was set in a vacuum hot pressing unit.

After the vacuum in the hot pressing unit had reached $5 \times 10^{-5}$ Torr, the powder mixture was degassed at a temperature of 600° C. for two hours, a central portion of the powder mixture was heated to 1300° C. at a temperature increase rate of 20° C./min to synthesize a molybdenum disilicide($MoSi_2$), and the degree of vacuum was thereafter reduced to $2 \times 10^{-2}$ Torr, followed by sintering at 1390° C. for 2 hours.

The sintered body thereby obtained was ground and polished and was worked by electrical discharge machining to finish a target having a diameter of 260 mm and a thickness of 6 mm.

REFERENCE EXAMPLE 17

Reference Example 17 was manufactured by the conventional manufacturing method in the following manner. An $MoSi_2$ powder having an average particle size of 35 μm and an Si powder having an average particle size of 30 μm were blended at a mixing ratio (Si/Mo) of 2.8 in terms of atomic ratio and were hot-pressed at 250 kg/cm² and at 1390° C. for 2 hours, thereby obtaining a target having a diameter of 260 mm and a thickness of 5 mm.

Sputtering was effected by using each of the targets obtained as Example 19 and Reference Example 17 to form a molybdenum silicide film having a thickness of about 3000 Å on a 5-inch silicon wafer (substrate).

Figure 2:
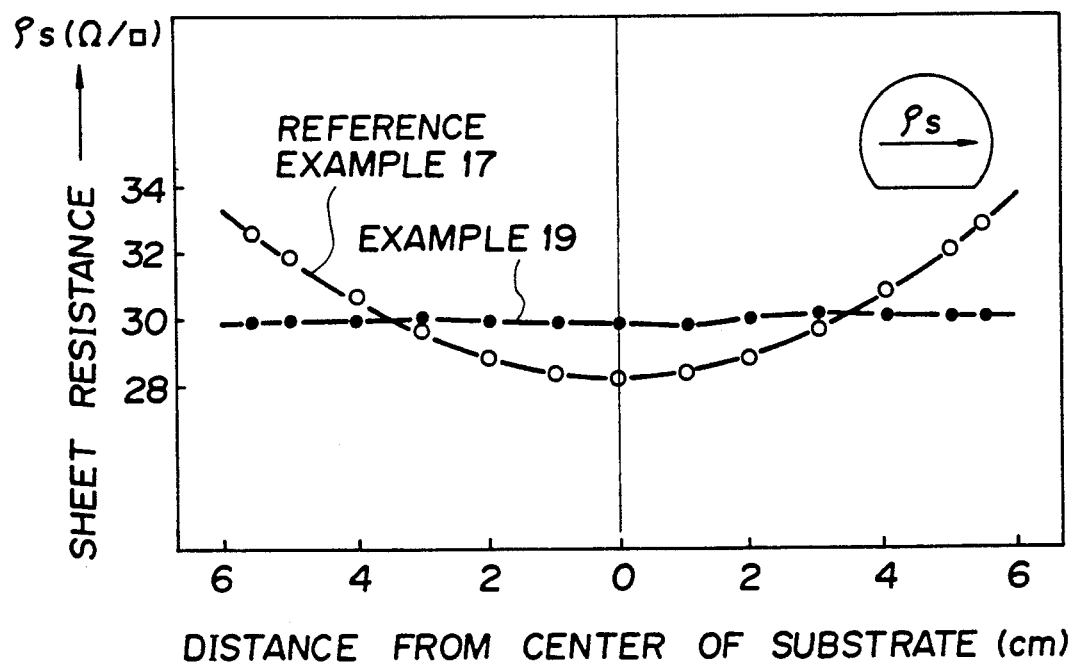
FIG. 2 is a graph of the relationship between the distance from the substrate center and the sheet resistance of each of the thin films in accordance with Example 19 and Reference Example 17.

The sheet resistance of the molybdenum silicide thin film thereby obtained was measured by the four-terminal method as in the case of Example 18 and Reference Example 16. FIG. 2 shows the results of this measurement.

It was confirmed that the sheet resistance of the silicide thin film formed by using the Example 19 target was substantially constant over the whole region unlike the conventional thin film formed by using Reference Example 17, and that the thin film composition was made uniform.

EXAMPLE 20

Example 20 of the present invention was manufactured in the following manner. A high purity W powder having an average particle size of 5 μm and a high purity Si powder having an average particle size of 15 μm were blended at a mixing ratio (Si/M) of 2.6 in terms of atomic ratio and were mixed in a dry mixing manner for 72 hours by a ball mill displaced by a high purity argon gas, and the same powders were blended at a mixing ratio of 3.0 and mixed in the same manner, thereby preparing two powder mixtures of the different mixing ratios.

Next, the powder mixture of the mixing ratio of 3.0 was packed in a central portion of a hot pressing mold formed of high purity graphite (having an inside diameter of 280 mm) while the powder mixture of the mixing ratio of 2.6 was packed on the outer peripheral side of the central portion. The mold was thereafter set in a vacuum hot pressing unit, and the powder mixtures were degassed in a vacuum of $5 \times 10^{-5}$ Torr at a temperature of 600° C. for 2 hours.

The powder mixtures were pressed at 250 kg/cm² and were heated to 1300° C. at a temperature increasing rate of 30° C./min. to synthesize tungsten disilicide (WSi₂), and the degree of vacuum in the furnace was thereafter reduced to $2 \times 10^{-2}$ Torr, followed by sintering at 1380° C. for 2 hours.

The obtained sintered body was ground and polished and was worked by electrical discharge machining to finish a target having a diameter of 260 mm and a thickness of 6 mm.

REFERENCE EXAMPLE 18

Reference Example 18 was manufactured by the conventional manufacture method in the following manner. A WSi₂ powder having an average particle size of 30 μm and an Si powder having an average particle size of 30 μm were uniformly mixed so that the mixing ratio (Si/M) in terms of atomic ratio was 2.7. The mixed powder was hot pressed under the following conditions:
hot-press temperature: 1380° C.
hot-press pressure: 250 kg/cm²
keeping time: 2 hours
to form a target having a diameter of 260 mm and a thickness of 6 mm.

Figure 3:
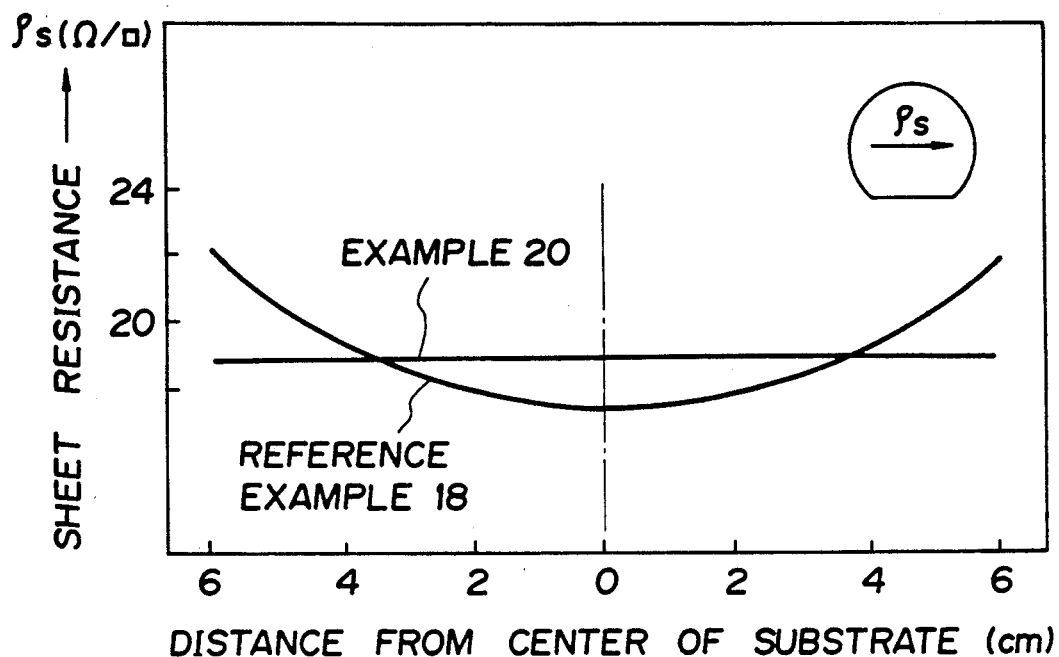
FIG. 3 is a graph of the relationship between the distance from the substrate center and the sheet resistance of each of the thin films in accordance with Example 20 and Reference Example 18.

Each of the targets obtained as the Example 20 and Reference Example 18 were set in a magnetron sputtering unit and sputtering was effected under a decompressed condition of an argon pressure of $2.3 \times 10^{-3}$ Torr, thereby depositing a tungsten silicide thin film having a thickness of about 3000 Å on a 5-inch silicon wafer (substrate). The sheet resistance of the obtained silicide thin film was measured by the pole-dipole array method. FIG. 3 shows the results of this measurement.

As is apparent from the results shown in FIG. 3, the sheet resistance of the tungsten silicide thin film formed by using the target in accordance with Example 20 was substantially constant over the whole region between the center and the periphery of the substrate unlike the conventional thin film formed by using Reference Example 18. It was thereby proved that the present invention enables a uniform thin film composition distribution.

According to these results, it is possible to provide high quality semiconductor products having uniform characteristics by using the target of the present invention to form electrode wirings of the semiconductor devices.

EXAMPLE 21

Example 21 of the present invention was manufactured in the following manner. A high purity Mo powder having an average particle size of 3 μm and a high purity Si powder having an average particle size of 15 μm were blended at a mixing ratio (Si/Mo) of 2.5 in terms of atomic ratio and were mixed in a dry mixing manner for 72 hours by a ball mill in the same manner as Example 20, and the same powders were blended at a mixing ratio of 2.9 and mixed in the same manner, thereby preparing two powder mixtures of the different mixing ratios. Next, the powder mixture of the mixing ratio of 2.9 was packed in a central portion of a hot pressing mold having an inside diameter of 280 mm which central portion was defined by a radius of 70 mm on the center of the mold center, while the powder mixture of the mixing ratio of 2.5 was packed on the outer peripheral side of the central portion. The mold was thereafter set in a vacuum hot pressing unit.

After the vacuum in the hot pressing unit had reached $5 \times 10^{-5}$ Torr, the powder mixtures were degassed at 600° C. for 2 hours. The powder mixtures were then pressed at 250 kg/cm² and were heated to 1300° C. at a temperature increasing rate of 20° C./min. to synthesize a disilicide (MoSi₂), and the degree of vacuum in the furnance was thereafter reduced to $2 \times 10^{-2}$ Torr, followed by sintering at 1390° C. for 2 hours.

The obtained sintered body was ground and polished and was worked by electrical discharge machining to finish a target having a diameter of 260 mm and a thickness of 6 mm.

REFERENCE EXAMPLE 19

Reference Example 19 was manufactured by the conventional manufacturing method in the following manner. An MoSi₂ powder having an average particle size of 30 μm and an Si powder having an average particle size of 30 μm were blended at a mixing ratio (Si/Mo) of 2.7 in terms of atomic ratio and were hot-pressed at 250 kg/cm² and at 1390° C. for 2 hours, thereby obtaining a target having a diameter of 260 mm and a thickness of 5 mm.

Sputtering was effected by using each of the targets obtained as Example 21 and Reference Example 19 to form a molybdenum silicide film having a thickness of about 3000 Å on a 5-inch silicon wafer (substrate).

Figure 4:
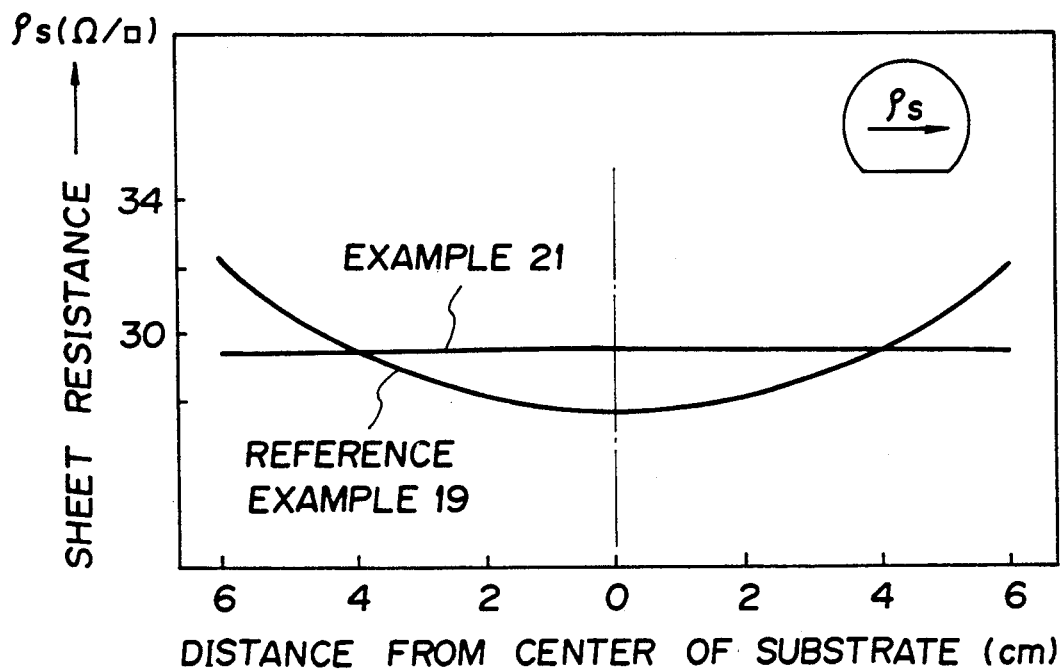
FIG. 4 is a graph of the relationship between the distance from the substrate center and the sheet resistance of each of the thin films in accordance with Example 21 and Reference Example 19.

The sheet resistance of the molybdenum silicide thin film thereby obtained was measured by the four-terminal method as in the case of Example 20 and Reference Example 18. FIG. 4 shows the results of this measurement.

It was confirmed that the sheet resistance of the silicide thin film formed by using the Example 21 target was substantially constant over the whole region of the substrate unlike the conventional thin film formed by using Reference Example 19, and that the thin film composition was made uniform.

What is claimed is:

1. A sputtering target formed of refractory metallic silicide having a composition $MSi_x$, said $MSi_x$ comprising:
    an $MSi_2$ phase in the form of particles where M is at least one refractory metal selected from the group consisting of tungsten, molybdenum, titanium, zirconium, hafnium, niobium and tantalum;
    an Si phase provided as a matrix phase; and
    an interface layer, comprised of at least one element selected from the group consisting of B, P, Sb and As collected by diffusion from the Si phase and having a predetermined thickness of at least 100 Å, provided between the $MSi_2$ phase and the Si phase.

2. A sputtering target according to claim 1, wherein a value X of the composition formula $MSi_x$ ranges from 2.0 to 4.0.

3. A sputtering target according to claim 1, wherein a thickness of the interface layers formed at the interfaces between the $MSi_2$ phase and the Si phase ranges from 100 to 5000 Å.

4. A sputtering target according to claim 1, wherein a spatial dispersion of the composition formula $MSi_x$ is within a range of ±0.05 in terms of Si/M atomic ratio, and a density ratio of the target is equal to or larger than 99%.

5. A sputtering target according to claim 1, wherein the Si phase contains at least one element selected from a group consisting of B, P, Sb and As, and has an electrical resistivity of 0.01 to 1 Ω·cm.

6. A sputtering target according to claim 1, wherein a roughness of a surface portion of the sputtering target expressed as center line roughness (Ra) is equal to or less than 0.05 μm.

7. A sputtering target according to claim 1, wherein a residual compressive stress in a surface portion of said target is equal to or less than 5 kg/mm².

8. A sputtering target according to claim 1, wherein: said target is in the form of a plate and is formed of refractory metallic silicide expressed by a composition formula $MSi_x$, said target having a composition distribution such that a value X increases from a peripheral portion of the target toward a center of the same.

9. A sputtering target according to claim 1, wherein the composition is set in such a manner that a value X of the composition formula $MSi_x$ continuously changes within a range of 2.0 to 4.0.

10. A sputtering target according to claim 1, wherein the target is formed of refractory metallic silicide expressed by a composition formula $MSi_x$, said target having a composition distribution such that a value X ranges from 2.0 to 4.0 and continuously decreases from a portion of a region eroded by sputtering toward a periphery of the same.

* * * * *

UNITED STATES PATENT AND TRADEMARK OFFICE
CERTIFICATE OF CORRECTION

PATENT NO. : 5,294,321
DATED : March 15, 1994
INVENTOR(S) : Michio SATOU, et al.

It is certified that error appears in the above-indentified patent and that said Letters Patent is hereby corrected as shown below:

On the title page, Item [22], the Filing Date should read as follows:

--Filed: Nov. 10, 1992--

Signed and Sealed this

Fifth Day of July, 1994

Attest:

BRUCE LEHMAN

*Attesting Officer*  *Commissioner of Patents and Trademarks*